US009449615B2

(12) United States Patent
Lamy

(10) Patent No.: US 9,449,615 B2
(45) **Date of Patent: *Sep. 20, 2016**

(54) EXTERNALLY ESTIMATED SNR BASED MODIFIERS FOR INTERNAL MMSE CALCULATORS

(71) Applicant: Continental Automotive Systems, Inc., Auburn Hills, MI (US)

(72) Inventor: Guillaume Lamy, Chicago, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 206 days.

This patent is subject to a terminal disclaimer.

(21) Appl. No.: 14/074,463

(22) Filed: Nov. 7, 2013

(65) Prior Publication Data

US 2015/0127330 A1 May 7, 2015

(51) Int. Cl.
*G10L 21/00* (2013.01)
*G10L 25/84* (2013.01)
*G10L 21/0216* (2013.01)
*G10L 15/00* (2013.01)
*H04R 5/00* (2006.01)
*H04M 9/08* (2006.01)
*H03B 29/00* (2006.01)
*G10L 21/0232* (2013.01)

(52) U.S. Cl.
CPC .......... *G10L 25/84* (2013.01); *G10L 21/0216* (2013.01); *G10L 21/0232* (2013.01)

(58) Field of Classification Search
USPC ....... 704/226, 234, 205, 240, 235, 215, 233; 381/71.1, 17, 94.3; 379/406.08
See application file for complete search history.

(56) References Cited

U.S. PATENT DOCUMENTS 8,239,194 B1 * 8/2012 Paniconi ............ G10L 21/0216 381/71.1
8,538,763 B2 9/2013 Yu (Continued)

FOREIGN PATENT DOCUMENTS

EP 1349148 A1 10/2003
WO 2014/032738 A1 3/2014

OTHER PUBLICATIONS

Search Report dated Jun. 24, 2014, from corresponding GB Patent Application No. GB1322969.5.

(Continued)

*Primary Examiner* — Pierre-Louis Desir
*Assistant Examiner* — Neeraj Sharma

(57) ABSTRACT

Acoustic noise in an audio signal is reduced by calculating a speech probability presence (SPP) factor using minimum mean square error (MMSE). The SPP factor, which has a value typically ranging between zero and one, is modified or warped responsive to a value obtained from the evaluation of a sigmoid function, the shape of which is determined by a signal-to-noise ratio (SNR), which is obtained by an evaluation of the signal energy and noise energy output from a microphone over time. The shape and aggressiveness of the sigmoid function is determined using an extrinsically-determined SNR, not determined by the MMSE determination.

8 Claims, 10 Drawing Sheets

(56) References Cited

U.S. PATENT DOCUMENTS

2005/0091049 A1* 4/2005 Yang .................. G10L 21/0208 704/226
2008/0082328 A1 4/2008 Lee
2009/0076814 A1* 3/2009 Lee .................. G10L 25/78 704/233
2010/0094625 A1* 4/2010 Mohammad ............ G10L 25/78 704/233
2012/0158408 A1 6/2012 McGowan
2014/0074467 A1* 3/2014 Ziv .................. G10L 25/78 704/235
2014/0126745 A1* 5/2014 Dickins .................. H04R 3/002 381/94.3
2014/0200881 A1* 7/2014 Chatlani ............. G10L 21/0264 704/205
2014/0334620 A1* 11/2014 Yemdji ............... G10L 21/0232 379/406.08
2015/0071446 A1* 3/2015 Sun .......................... H04S 5/00 381/17

OTHER PUBLICATIONS

Ephraim et al., "Recent Advancements in Speech Enhancement", May 17, 2004, 22 pages.

* cited by examiner

EXTERNALLY ESTIMATED SNR BASED MODIFIERS FOR INTERNAL MMSE CALCULATORS

CROSS-REFERENCE TO RELATED APPLICATIONS

This application is related to the following applications: Accurate Forward SNR Estimation Based On MMSE Speech Probability Presence, invented by Guillaume Lamy and Bijal Joshi, filed on Nov. 7, 2013, and identified by Application Ser. No. 14/074,423; and Speech Probability Presence Modifier Improving Log-MMSE Based Noise Suppression Performance, invented by Guillaume Lamy and Jianming Song, filed on Nov. 7, 2013, and identified by Application Ser. No. 14/074,495.

BACKGROUND

Numerous methods and apparatus have been developed to suppress or remove noise from information-bearing signals. A well-known noise suppression method uses a noise estimate obtained using a calculation of a minimum mean square error or "MMSE." MMSE is described in the literature. See for example Alan V. Oppenheim and George C. Verghese, "Estimation With Minimum Mean Square Error," MIT Open CourseWare, http://ocw.mit.edu, last modified, Spring, 2010, the content of which is incorporated herein by reference in it is entirety.

While Log-MMSE is an established noise suppression methodology, improvements have been made to it over time. One improvement is the use of the speech probability presence or "SPP" as an exponent to the log-MMSE estimator, $\hat{q}$ which is also known as the optimal log-spectral amplitude based estimator or "OLSA" approach, which makes the MMSE algorithm effectively reach its maximum allowed amount of attenuation.

The OLSA modification of the Log-MMSE noise estimation suffers from two known problems. One problem is that it increases so called musical noise in low signal-to-noise ratio situations. Another and more significant problem is that it also over-suppresses weak speech in noisy conditions. An MMSE-based noise estimation that reduces or avoids the problems known to exist with the prior art, OLSE modification of an MMSE-based noise estimate determination would be an improvement over the prior art.

DETAILED DESCRIPTION

Noise is considered herein to be an unwanted, non-information-bearing signal in a communications system. White noise or random noise is random energy, which has a uniform distribution of energy. It is most commonly generated by electron movement, such as current through a semiconductor, resistor, or a conductor. Shot noise is a type of un-random noise, which can be generated when an electric current flows abruptly across a junction or connection. Acoustic noise is either an unwanted or an undesirable sound. In a motor vehicle, acoustic noise includes, but is not limited to, wind noise, tire noise, engine noise, and road noise.

Acoustic noise is readily detected by microphones that must be used with communications equipment. Acoustic noise is thus "added" to information-bearing speech signals that are detected by a microphone.

Suppressing acoustic noise thus requires selectively attenuating audio-frequency signals, which are determined to be, or are believed to be, unwanted or undesirable, non-information bearing signals. Unfortunately, many acoustic noises are not continuous and can be difficult to suppress.

As used herein, the term, "band-limited" refers to a signal, the power spectral density of which is zero or "cut off," above a certain, pre-determined frequency. The pre-determined frequency for most telecommunications systems including both cellular and wire line is eight-thousand Hertz (8 KHz).

Figure 1:
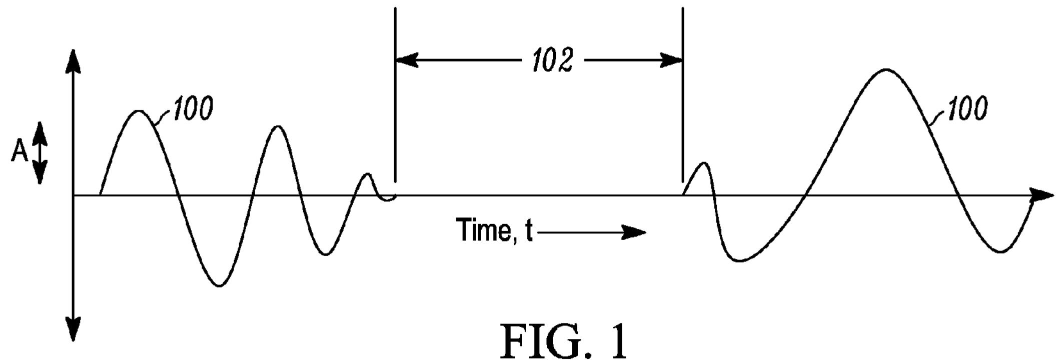
FIG. 1 is a plot of a single waveform, representative of a clean, speech signal.

FIG. 1 is a depiction of a short period of a single, clean, band-limited audio signal 100, such as voice or speech, which varies over time, t. For clarity and simplicity purposes only one waveform corresponding to one signal is shown. As those of ordinary skill in the art know, the audio signal 100 is somewhat "bursty" over short periods of time, measured in milliseconds. The signal 100 thus inherently includes short periods of time 102 during which the audio signal is missing.

The signal 100 depicted in FIG. 1 varies in amplitude over time. The signal 100, including the periods of silence or quiet 102 is thus known to those of ordinary skill in the art as being a signal that is in the time domain.

Figure 2:
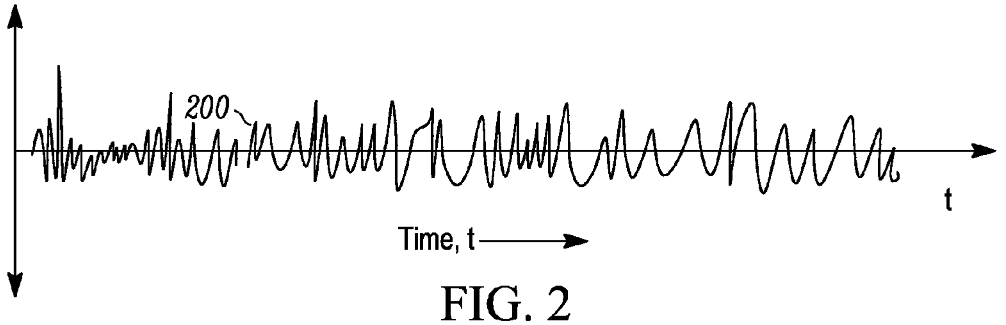
FIG. 2 is a plot of a background acoustic noise signal.

FIG. 2 depicts a few hundred millisecond of an acoustic noise signal 200. Unlike the audio signal 100 shown in FIG. 1, the noise signal 200 is depicted as substantially constant over at least the few hundred millisecond depicted in FIG. 2. The noise signal 200, could, however, be constant over long periods of time, as will happen when the noise signal is from wind noise, road noise, and the like.

As is well known, in a motor vehicle, speech and noise are usually co-existent which is to say, when a speech signal 100 and an acoustic noise signal 200 are detected at the same time by the same microphone, as happens when a person is using a microphone in a vehicle while the vehicle is moving along at a relatively high speed with a driver's window open, the noise 200 and speech 100, the microphone will add the speech and noise together.

Figure 3:
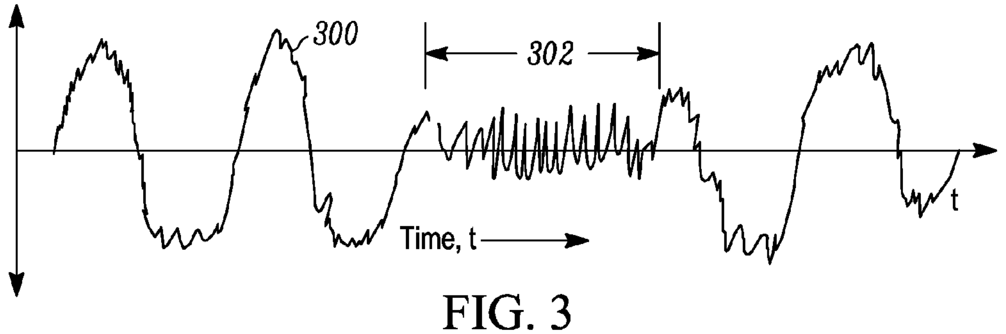
FIG. 3 is a plot representing a noisy speech signal, i.e., a clean speech signal such as the one shown in FIG. 1 and a background acoustic noise signal, such as the one shown in FIG. 2.

FIG. 3 is a simplified depiction of the speech signal 100 of FIG. 1 when the noise signal 200 shown in FIG. 2 is added to the speech, as happens when a microphone transduces both a speech signal 100 and acoustic background noise 200. As shown in FIG. 3, the resultant signal 300 is a "noisy," band-limited audio signal 300, which is a combination of clean, band-limited audio signal 102, such as the one shown in FIG. 1 and an acoustic noise signal 200, such as the one shown in FIG. 2 The noise signal 200 can be seen to have been "added to" the clean speech signal 100. Note too that in FIG. 3, time periods of relative quiet 102 or speech absence 102 are "filled" with background noise 200. In FIG. 3, the time period identified by reference numeral 302 shows where the background noise signal shown in FIG. 2 occupies the otherwise quiet period 102 of the signal shown in FIG. 1.

The voice or audio communications provided by most telecommunications systems including cellular systems are actually provided by the transmission and reception of digital data that represents time-varying or analog signals, such as those shown in FIGS. 1 and 2. The process of converting an analog signal to a digital form is well-known and requires sampling a band-limited signal at rate that is at least two-times, or double, the highest frequency that is present in the band-limited signal. Once the samples of an analog signal are taken, the samples are converted to digital values or "words" which represent the samples. The digital values representing a sample of an analog signal are transmitted to a destination where the digital values are used to re-create the samples of an analog signal from which the original samples were taken. The re-created samples are then used to re-create the original analog signal at the destination.

Figure 4:
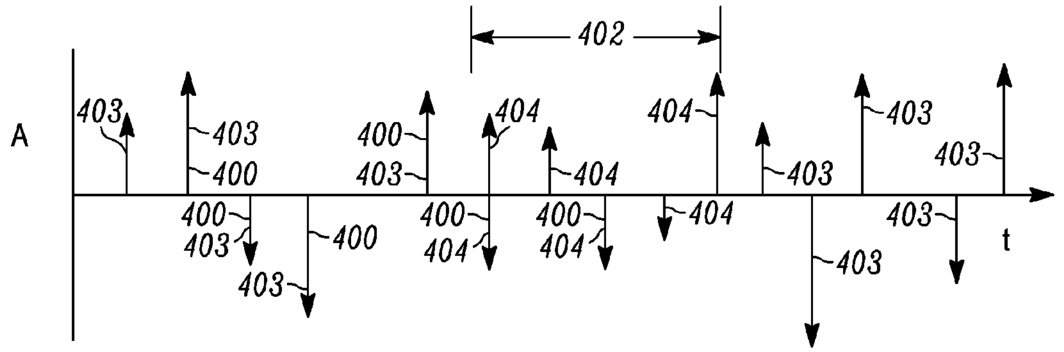
FIG. 4 depicts samples of the noisy speech signal shown in FIG. 3.

FIG. 4 depicts samples 400 of the noisy, band-limited audio signal 300 shown in FIG. 3. Some of the samples 404 of a noisy signal 300 will be samples of only the acoustic noise 200, which was "added" by a microphone. Other samples 403 will represent an information-bearing audio signal 100 and noise 200.

Regardless of whether the samples 400 represent a clean signal 100 and noise 200 or only noise 200, all of the samples 400 are converted to binary values for transmission to a destination. As set forth below, however, at least some of the noise 200 comprising the noisy signal 300 can be suppressed or removed if components of the noisy signal 300 due to the noise 200 are suppressed. It is thus desirable to identify or determine whether a sample of a noisy signal actually represents or is at least likely to represent a signal 100 or noise 200.

The term Fast Fourier Transform (FFT) refers to a process, well-known to those of ordinary skill in the digital signal processing art, by which a time domain signal, including digital signals, can be converted to the frequency domain. Stated another way, the FFT provides a method by which a time domain signal is represented mathematically using a set of individual signals of many different frequencies, which when combined together will re-form or reconstruct the time domain signal. Put simply, a signal in the frequency domain is simply a numeric representation of various sinusoidal signals, each being of a different frequency, which when added together, will re-constitute the time-domain signal.

Those of ordinary skill in the digital signal processing art know that the manipulation and processing of both analog and digital signals is preferably done in the frequency domain. Those of ordinary skill in the digital signal processing art also know that samples of an analog signal and digital representations of such samples can also be converted to and processed in the frequency domain using the FFT. Further description of FFT techniques are therefore omitted for brevity.

Figure 5A:
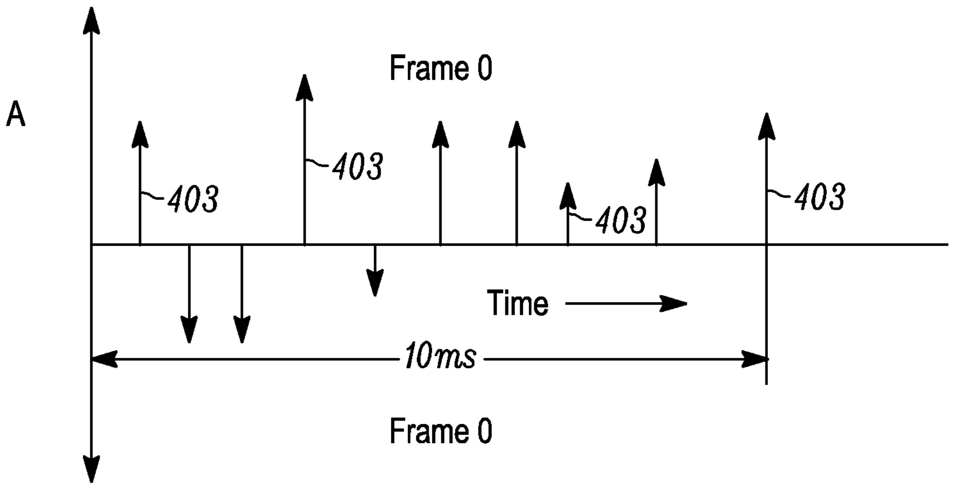
FIG. 5A depicts a first frame of data samples, which in a preferred embodiment comprises ten consecutive samples of a noisy speech signal.

FIG. 5A depicts the first ten consecutive samples 400 shown in FIG. 4 and which comprise a first frame of samples, Frame 0, representing a noisy audio signal, such as the noisy signal 300 shown in FIG. 3. As such, the frame of samples shown in FIG. 5A includes samples of a clean signal 100 that was combined with noise 200.

Figure 5B:
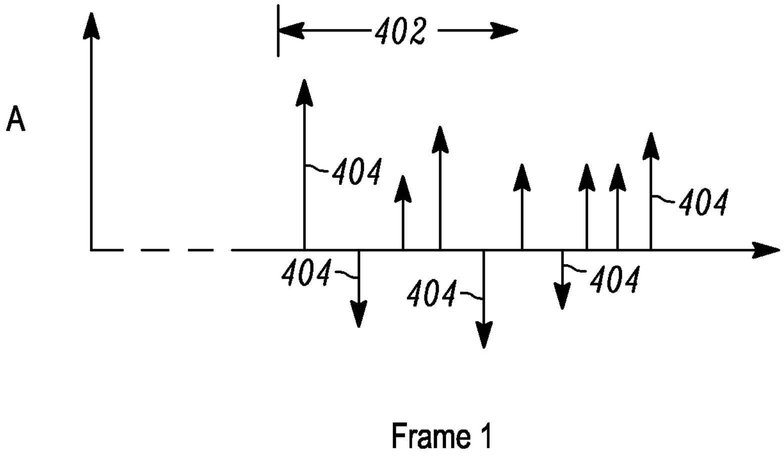
FIG. 5B depicts a second frame of data samples, which comprises ten samples that occur after the first ten shown in FIG. 5A.

FIG. 5B depicts a second group of ten consecutive samples 404 shown in FIG. 4, taken during the interval identified by reference numeral 402 and which comprise a second frame of samples, Frame 1, representing only noise 200.

Figure 6A:
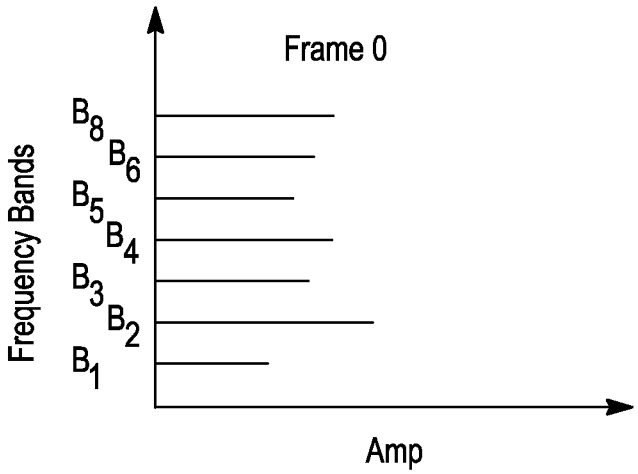
FIGS. 6A and 6B depict the relative amplitudes of multiple frequency component bands or ranges, which represent respectively the first and second frames in the frequency domain.
Figure 6B:
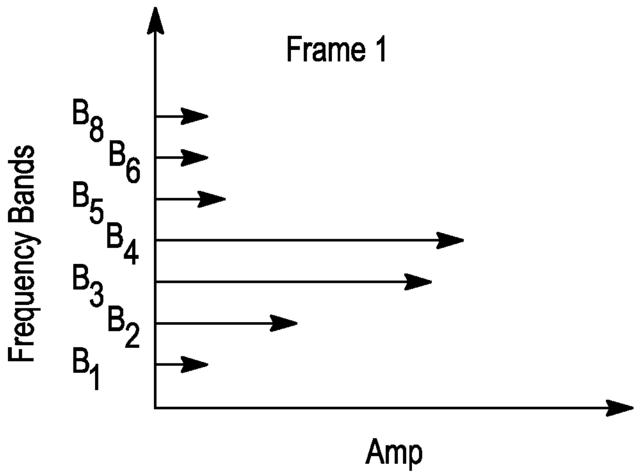

FIGS. 6A and 6B depict relative amplitudes of various different frequencies in different frequency bands B1-B8 of the ten samples shown in FIGS. 5A and 5B. The frequency components shown in FIGS. 6A and 6B represent the results of a conversion of the frames, which are in the time domain, to the frequency domain.

Different bands of component frequencies, B1-B8, which comprise a FFT of the ten samples of each frame are shown on the vertical axes of each graph; the relative amplitude, Amp, of each frequency band B1-B8 component present in the FFT of a frame is displayed along the "x" axis. FIGS. 6A and 6B thus show how ten consecutive samples or a frame of a signal can be represented in the frequency domain by the relative amplitudes of different frequencies. The audio plus noise as well as the noise alone can thus be represented by different frequencies of differing amplitudes.

Those of ordinary skill in the digital signal processing art know that methods exist by which time domain frames of samples of a noisy signal 300, such as the frames shown in FIGS. 5A and 5B, can be converted to and digitally processed in the frequency-domain. Once the samples are converted to the frequency domain, the frequencies representing the time-domain samples, which represent the original noisy signal 300, can be selectively attenuated in order to suppress or attenuate frequency components identified, or at least believed, to be noise 200. Stated another way, when a frame of samples 402 is converted from the time domain to the frequency domain and FFT representations of the frame are selectively processed to determine whether the frame is likely to contain voice or noise, individual frequencies representing the noise 200 can be attenuated in the frequency domain such that when the original, time domain signal is reconstructed, the noise content 302 present in the original, noisy signal 300 will be reduced or eliminated.

For computational efficiency, the apparatus and method described herein evaluates digital representations of signal samples, ten at a time. Ten such representations are referred to herein as a "frame." The processing is preferably performed by a digital signal processor (DSP), but can also be performed by an appropriately-programmed general-purpose processor.

Figure 7:
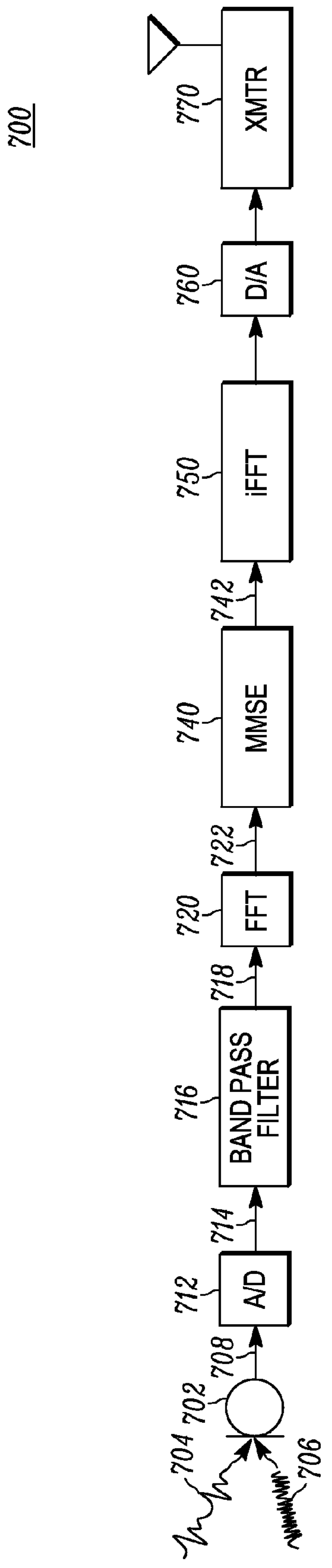
FIG. 7 is a block diagram of a wireless communications device, configured to have an enhanced MMSE determiner.

FIG. 7 is a simplified block diagram of a wireless communications device 700. The device 700 comprises a conventional microphone 702, which transduces audio-frequency signals that include a speech signal 704 and a background acoustic noise signal 706 to an electrical analog signal 708. The output signal 708 from the microphone 702 is thus an information-bearing speech signal 704 that is combined with background noise 706 that the microphone 702 also picked up.

The noisy speech 708 output from the microphone 702 is converted to a digital format signal 714 by a conventional analog-to-digital (A/D) converter 712. As is well known, the A/D converter 712 samples the analog signal at a predetermined rate and converts the samples to binary values, i.e., digital values.

The digital values from the A/D converter 712, which are representations 714 of the samples of the noisy speech signal 708 are filtered digitally in a conventional, digital, band pass filter 716, which band-limits the digital signal 714 and thus effectively band-limits signals from the microphone 702. Digital filtering is well known to those of ordinary skill in the art.

The band-limited digital representations 718 of noisy speech signal 708 are converted to the frequency domain 722 by a conventional FFT converter 720. Several methods of computing a Fast Fourier Transform (FFT) are well known to those of ordinary skill in the digital signal processing art. A description of FFT determinations is therefore omitted for brevity.

Frequency domain signals 722 from the FFT converter 720 are provided to an MMSE determiner 740. The MMSE determiner 740 processes frequency domain representations of samples in frames, i.e., ten samples at a time, to determine whether the frames are likely to represent speech or noise. The MMSE determiner 740 attenuates frames likely to be noise. Frames from the MMSE determiner 740 are provided to a conventional inverse Fast Fourier Transform (iFFT) converter 750. It re-constructs digital representations of the original samples, minus at least some of the background noise picked up by the microphone 702. A conventional digital-to-analog converter (D/A) 760 reconstructs the original noisy audio signal, but as a noise-reduced signal 762, which is transmitted from a conventional transmitter 770. Noise suppression thus takes place in the frequency domain processing performed by the MMSE determiner 740.

As described below, digital signal processing in the frequency domain by the MMSE determiner 740 provides contemporaneous and adaptive probabilities or estimates of whether signal(s) coming from the microphone 702 are speech or noise. The MMSE determiner 740 also provides attenuation factors that are used to selectively attenuate components of each sub-band, examples of which are the sub-bands B1-B8 depicted in FIGS. 6A and 6B. It is therefore important to accurately estimate whether a frequency domain representation of a signal is one that represents speech or noise.

As used herein, "real time" refers to a mode of operation in which a computation is performed during the actual time that an external process occurs, in order that the computation results can be used to control, monitor, or respond in a timely manner to the external process. Determining whether a frequency-domain representation of a signal sample might represent voice or noise is well-known, but non-trivial, and requires numerous computations to be made in real time, or nearly real time. For computational-efficiency purposes, the determination of whether a sample might contain, or represent, speech or noise is not performed on a sample-by-sample basis, but is, instead, performed on multiple consecutive samples comprising a frame. In a preferred embodiment, the determination of whether signals from a microphone contain speech or noise is based on analyses of data representing multiple different frequency bands in ten consecutive samples, the ten samples being referred to herein as a frame of data.

Put simply, the MMSE determiner is configured to analyze frequency-domain representations of frames of a noisy audio signal data to determine an improved likelihood, or probability, that they represent a signal or noise. As used herein, speech presence probability, or SPP, and the symbol $\hat{q}$ are used interchangeably. The MMSE determiner 740 thus comprises an embellishment of a prior art process for determining a speech presence probability or "SPP" described by Ephraim and Cohen, "Recent Advancements in Speech Processing," May 17, 2004, referred to hereafter as "Ephraim and Cohen," the content of which is incorporated herein by reference. See also Y. Ephraim and D. Malah, "Speech enhancement using a minimum mean square error short time spectral amplitude estimator," IEEE Trans. Acoust., Speech, Signal Processing, vol. 32, pp. 1109-1121, December 1984; P. J. Wolfe and S. J. Godsill, "Efficient alternatives to Ephraim and Malah suppression rule for audio signal enhancement," EURASIP Journal on Applied Signal Processing, vol. 2003, Issue 10, Pages 1043-1051, 2003; Y. Ephraim and D. Malah, "Speech enhancement using a minimum mean square error Log-spectral amplitude estimator," IEEE Trans. Acoust., Speech, Signal Processing, vol. 33, pp. 443-445, December 1985, the contents of all of which are incorporated herein by reference in their entireties.

As used herein, the term, gain actually refers to an attenuation. As the term is used herein, a gain is therefore negative. In Ephraim and Cohen and the figures herein, gain is represented by the variable "G," as in $G_{mmse}$.

The MMSE determiner 740 determines an SPP, which, as described above, is an estimate, or probability, that a frame contains speech. The MMSE determiner 740 also determines an attenuation, or gain factor, to be applied to the components of each of the various frequency sub-bands in each frame, as disclosed by Ephraim and Cohen.

The SPP, or $\hat{q}$, and attenuation, $G_{mmse}$, provided by the MMSE methodology espoused by Ephraim and Cohen are determined adaptively, frame-by-frame. The SPP determined for a first frame is used in the determination of an SPP for a subsequent frame.

The MMSE espoused by Ephraim and Cohen also requires an estimate of a signal-to-noise ratio (SNR). Unfortunately, when the value of the SNR used by the MMSE method of Ephraim and Cohen goes low, the resultant SPP and $G_{mmse}$ values will be incorrect. As a result, noise, and hence voice accompanied by noise, will be increasingly over-suppressed. Stated another way, the MMSE calculation as described by Ephraim and Cohen relies on an estimate of a signal-to-noise ratio (SNR), which is typically inaccurate.

In the preferred embodiment of the MMSE determiner 740 disclosed herein, the SPP determined using the method of Ephraim and Cohen is modified after it is calculated. The modification is performed responsive to an externally-provided, and externally-determined, signal-to-noise ratio in order to reduce, or eliminate, the over-attenuation of speech when a signal-to-noise ratio is low, i.e., below about 1.5:1. In a preferred embodiment and as described below, under certain SNR conditions, the SPP modification is non-linear, and, under other SNR conditions, the SPP modification is linear.

Figure 8A:
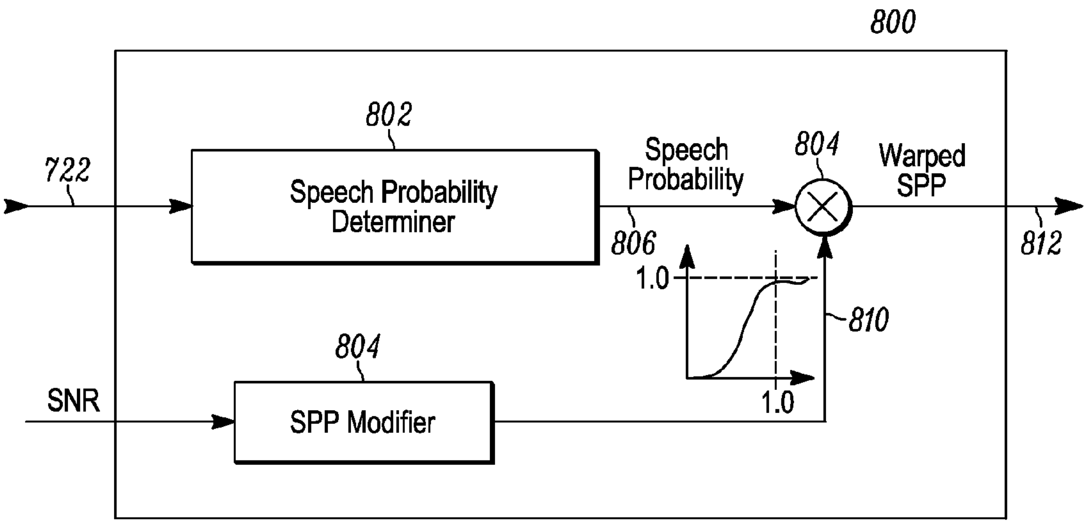
FIG. 8A is a block diagram of an enhanced MMSE determiner.

FIG. 8A is a block diagram of an enhanced MMSE determiner 800 for use in a communications device, such as the device shown in FIG. 7. The MMSE determiner 800 comprises a speech probability (SPP) determiner 802, a multiplier 804, and an SPP modifier 806.

The SPP determiner 802 provides an SPP 806, as described by Ephraim and Cohen. The multiplier 804 modifies the SPP 806 by an SPP modification factor 810, which is a value between zero and a number obtained from the SPP modifier 806. The output 812 of the multiplier 804 is a "warped SPP," so named because the modification factor 810 obtained from the SPP modifier 806 is a value that varies non-linearly.

In the preferred embodiment, the SPP modifier provides an SPP modification factor 810 by evaluating a non-linear function, preferably a sigmoid function, parameters of which represent an externally-provided signal-to-noise ratio (SNR), preferably determined in real-time and from actual signal values. The enhanced MMSE determiner 800 thus provides an SPP that is inherently more accurate than is possible using Ephraim and Cohen because the SPP from the MMSE determiner 800 is determined responsive to a real-time SNR.

Figure 8B:
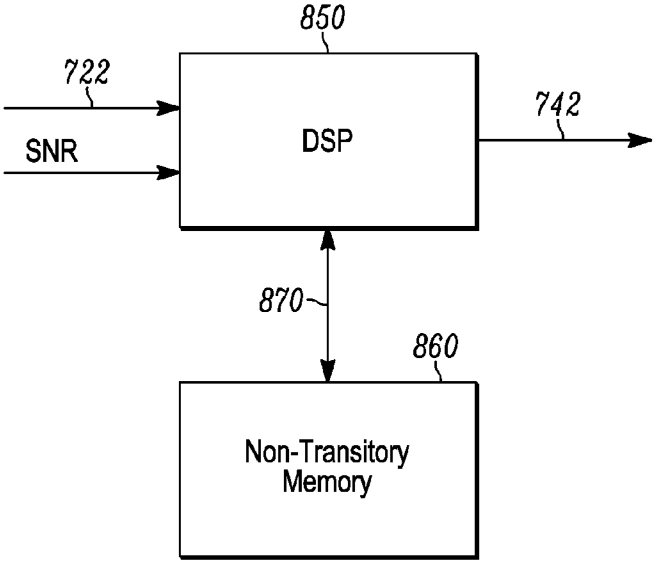
FIG. 8B is a block diagram of a preferred implementation of an MMSE determiner.

As can be seen in FIG. 8B, the MMSE determiner 800 is preferably embodied as a digital signal processor (DSP) 850, which is coupled to a non-transitory memory device 860, which stores executable instructions. The DSP 850 is coupled to the memory device 860 via a conventional bus 870. The DSP outputs values of SPP and frames of data representing ten consecutive voice samples, the frequency components of which are attenuated as described herein in order to reduce, or eliminate, noise 200 from a noisy audio signal 300.

Figure 9:
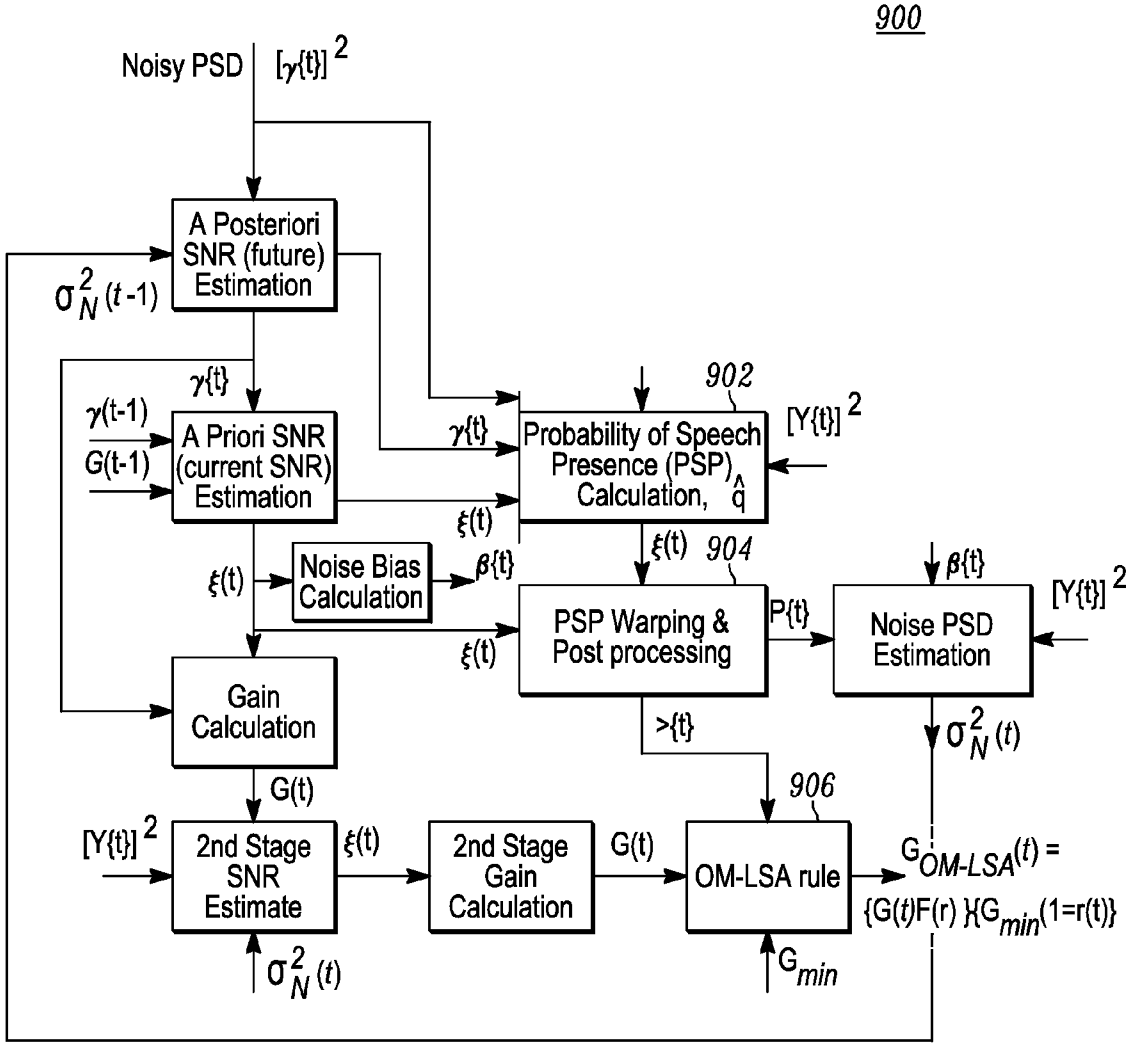
FIG. 9 is a flow chart/block diagram depiction of the operation of the enhanced MMSE determiner.

Executable instructions in the non-transitory memory cause the DSP to perform operations on frames of data, as shown in FIG. 9, which is a block diagram depicting a preferred method of improving a log-MMSE based noise suppression by the determination of an SPP from a real-time, or near-real time, SNR obtained from an external source, i.e., not the MMSE itself.

Referring now to FIG. 9, which depicts the operation of the MMSE determiner 800, at step 902, samples of a noisy signal that comprise a "frame," and which are, therefore, considered to be of an identical occurrence time, t, are processed by the speech probability determiner 802 to provide an SPP for each of the frequency bands, k, for a frame. The processing provided at step 902 provides an SPP, or $\hat{q}$, by evaluating Eq. 3.11, as taught by Ephraim and Cohen, a copy of which is inset below.

$$\hat{q}_{tk} = \left[1 + \frac{1 - \hat{q}_{tk|t-1}}{\hat{q}_{tk|t-1}}\left(1 + \hat{\xi}_{tk}\right)\exp\left(-\hat{\vartheta}_{tk}\right)\right]^{-1} \tag{3.11}$$

In Eq. 3.11, and in the MMSE determiner 800, "k" is a frequency sub-band, i.e., a range of frequencies provided by evaluation of a Fast Fourier Transform; "t" is a frame of data, i.e., ten or more consecutive frequency-domain representations of samples taken from a noisy voice signal, which are "lumped" together. $\xi$ is a signal-to-noise (SNR) ratio estimate of a first frame; u is a SNR estimate of a subsequent frame. SPP, or $\hat{q}$, is thus determined adaptively, frame after frame. See Eprhaim and Cohen, p. 10.

As can be seen in Eq. 3.11, the value of $\hat{q}$ for a particular frame of data is obtained using a previously-determined $\hat{q}$, i.e., a $\hat{q}$ for a previous frame, which is denominated as a $\hat{q}_{tk|t-1}$. SPPs change over time responsive to changes in the values of $\xi$ and u, which depend on a SNR. The accuracy of SPP will thus depend on a SNR.

The SPP, or $\hat{q}$, resulting from a computation of Eq. 3.11 is a scalar, the value of which ranges between zero and one with zero and values there between. A zero indicates a zero probability that a particular band of frequencies of a frame data, contains speech data; one indicates a virtual certainty that a corresponding band of frequencies of a frame of data contains speech.

As can also be seen in Eq. 3.11, when a signal-to-noise ratio, $\xi$, is small, i.e., close to 1:1, as will happen when a channel is noisy, the SPP will, as a result, also be small. A small-valued SPP means that a sample is unlikely to represent speech, which will trigger attenuation of a frame's component frequencies. Eq. 3.11 thus provides at least one unfortunate characteristic of the MMSE espoused by Ephraim and Cohen, which is an unwanted over-attenuation of speech when a SNR approaches one. Incorrect SNR values can provide unacceptable speech attenuation.

Figure 11:
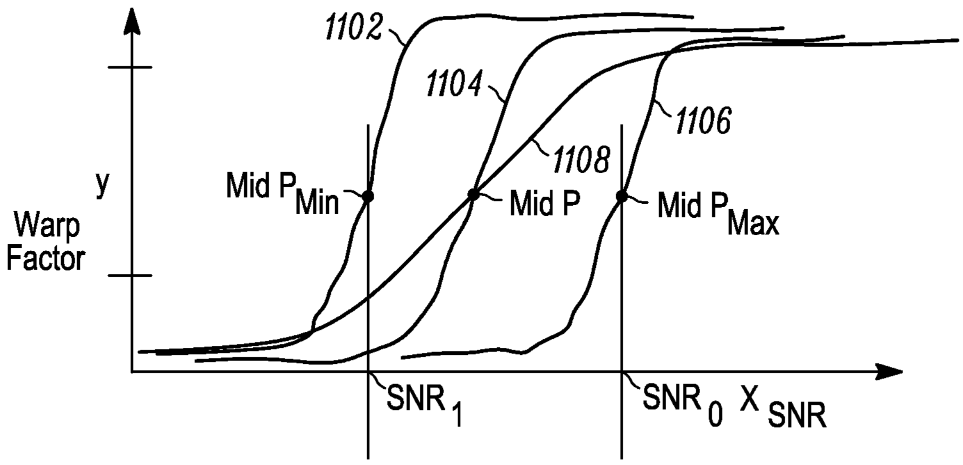
FIG. 11 depicts four sigmoid curves.

In order to reduce, or eliminate, the over-suppression speech signals in noisy conditions, the MMSE determiner 800 shown in FIG. 8 is configured to modify the value of $\hat{q}$ that is determined from Eq. 3.11, responsive to receipt of a SNR, on a frame-by-frame basis. As shown in FIG. 8 and FIG. 9, the $\hat{q}$ provided by Eq. 3.11 of Ephraim and Cohen is modified by "multiplying" that value of $\hat{q}$ by a number obtained by the evaluation of a non-linear function, preferably a sigmoid function, the form of which is:

$$y = \frac{1}{1 + e^{-c(x+b)}} \tag{Eq. 1}$$

the general shape of which is provided in FIG. 11, which shows three sigmoid curves 1102, 1104, 1106, the shapes of which are substantially the same.

In general, a sigmoid curve has two characteristics: a slope or non-linearity, c, and a mid-point, b. The output of the sigmoid function, y, is considered herein to be a warp factor. The value of y that is obtained when values of "x," are away from the mid-point, b, and in the non-linear regions 1108 of the curves, non-linearly change, or warp, an SPP determined using the MMSE obtained using the methodology of Ephraim and Cohen.

In a sigmoid equation, "b" is the mid-point of the sigmoid curve. In the Applicant's preferred embodiment, the value of "x" is a signal-to-noise ratio or SNR. Unlike the SNR used in the conventional MMSE methodology, in the Applicant's preferred embodiment, a SNR is preferably obtained from an external source, as described below. The midpoint, b, is also determined by the externally-provided SNR.

The values of the mid-point, b, of the sigmoid curve, the slope, c, and x or SNR determine the value of y, the value of which may be referred to as a warping factor. The value of the warp factor, y, determines the degree to which the SPP determined by the SPP determiner 802 is warped or modified. For a given SNR and slope, c, changing the midpoint, b, will change the aggressiveness of the sigmoid function.

In a preferred embodiment of the Applicant's invention, the warping tends to decrease when noise becomes overwhelming, i.e., when the SNR is low. It is, therefore, desirable to reduce the sigmoid warping to be less aggressive in high noise situations in order to maintain a speech probability presence even though it might be unreliable. Modifying the sigmoid warping, and hence it aggressiveness, is accomplished by "shifting" the sigmoid curve left and right along the x axis. In so doing, the mid-point of the sigmoid curve will also shift. Conversely, shifting the midpoint of a sigmoid curve will also shift the sigmoid left and right and change the aggressiveness of the sigmoid warping.

Referring now to FIG. 11, which shows four sigmoid curves 1102, 1104, 1106, and 1108, the determination of a mid-point, P, for a sigmoid curve evaluated by the SPP modifier 662 is made according to the following equation:

$$Warp_{factor}(realSNR) = \begin{cases} 1 & realSNR \leq SNR_1 \\ \dfrac{realSNR - SNR_0}{SNR_1 - SNR_0} & SNR_1 < realSNR < SNR_0 \\ 0 & realSNR \geq SNR_0 \end{cases} \quad \text{(Eq. 2)}$$

In the equation above, $SNR_0$ and $SNR_1$ are experimentally-determined constants, preferably about 2.0 (1.6 dB) and 10.0 (10 dB), respectively. $Warp_{factor}$(realSNR) varies between 0.0 and 1.0. The determination of realSNR is explained below.

Using a predetermined, or desired, Warpfactor, the midP for the curves shown in FIG. 11, which is also bin a sigmoid function, is computed as:

$$midP = Warp_{factor} \cdot (midP_{min} - midP_{max}) + midP_{max} \quad \text{(Eq. 3)}$$

The limits, midPmax and midPmin, are experimentally determined limits for midP, preferably about 0.5 and about 0.3, respectively. They limit or define the range of values that the warp factor can attain.

In Eq. 3 above, selecting values for $midP_{min}$, $midP_{max}$ and $Warp_{factor}$ will move the value of the mid-point, b, along the x axis. By moving the value of, midP, rightward toward midPmax the non-linear warping is reduced, or minimized, when the SNR goes low. Moving the midpoint, midP, left towards $midP_{min}$ increases the non-linear warping (more effect) when SNR gets high in order to maintain speech in noisy conditions while cleaning musical noise in less noisy conditions.

The slope, c, of the sigmoid curves can be selectively made either very aggressive or neutral, i.e., linear or almost linear. In FIG. 11, the curves identified by reference numerals 1102, 1104, and 1106 have different midpoints and slopes that are essentially the same. The curve identified by reference numeral 1108, however, has the same midpoint as the curve identified by reference numeral 1104 but a reduced or less aggressive slope. When a sigmoid curve slope is aggressive, such as the curve identified by reference numeral 1108, the value of the SPP becomes more discriminative between noise and speech portions of the current frame's spectrum. When the sigmoid curve slope is linear, or nearly linear, SPP, as calculated by the MMSE, is essentially unchanged. In a preferred embodiment, the slope, c, and the midpoint are determined by signal-to-noise ratios.

An objective, or goal, in selecting a sigmoid curve shape is to make SPP neutral when in low SNR conditions in order to maintain as much speech as possible and to make SPP more discriminative when a SNR is relatively high, i.e., a maximum noise suppression, Gmin, is realized.

The Sigmoid warping slope c(Warp_facor) is a linear function of the Warp_factor:

$$c(Warp_{factor} \cdot) = a \cdot Warp_{factor} + b \quad \text{(Eq. 4)}$$

As set forth above, however, a warp factor is a function of SNR. The coefficients "a" and "b" are calculated as:

$$a = (C_{MIN} - C_{MAX}),\ b = C_{MIN} - a \quad \text{(Eq. 5)}$$

$C_{MIN}=1$ and $C_{MAX}=15$ are determined, or selected, experimentally and define maximum and minimum degrees of non-linear warping.

It was determined experimentally that the mid-point b, should be held between a maximum value $b_{max}$ equal to about 0.8 and a minimum value $b_{min}$, equal to about 0.3, in order to limit the degree by which the SPP 806 can be attenuated or warped responsive to a SNR.

Referring again to FIG. 8, the product of $\hat{q}$, obtained using Eq. 3.11 and provided by the SPP determiner 802, and the value of a sigmoid function, as set forth above, is a warped SPP. It is also the value substituted for $\hat{q}$ in the computation of $\hat{q}$ for the next frame of data.

As shown in FIG. 9, the warped SPP is determined using two SNRs. Stated another way, the Applicant's method and apparatus adaptively updates the calculation of an SPP, or $\hat{q}$, using a sigmoid function, the shape of which is controlled, or determined, responsive to a signal to noise ratio in order to smooth, or reduce, attenuation of voice when SNR is low and to increase the attenuation when the value of $\hat{q}$ output from Eq. 3.11 is high.

Figure 10A:
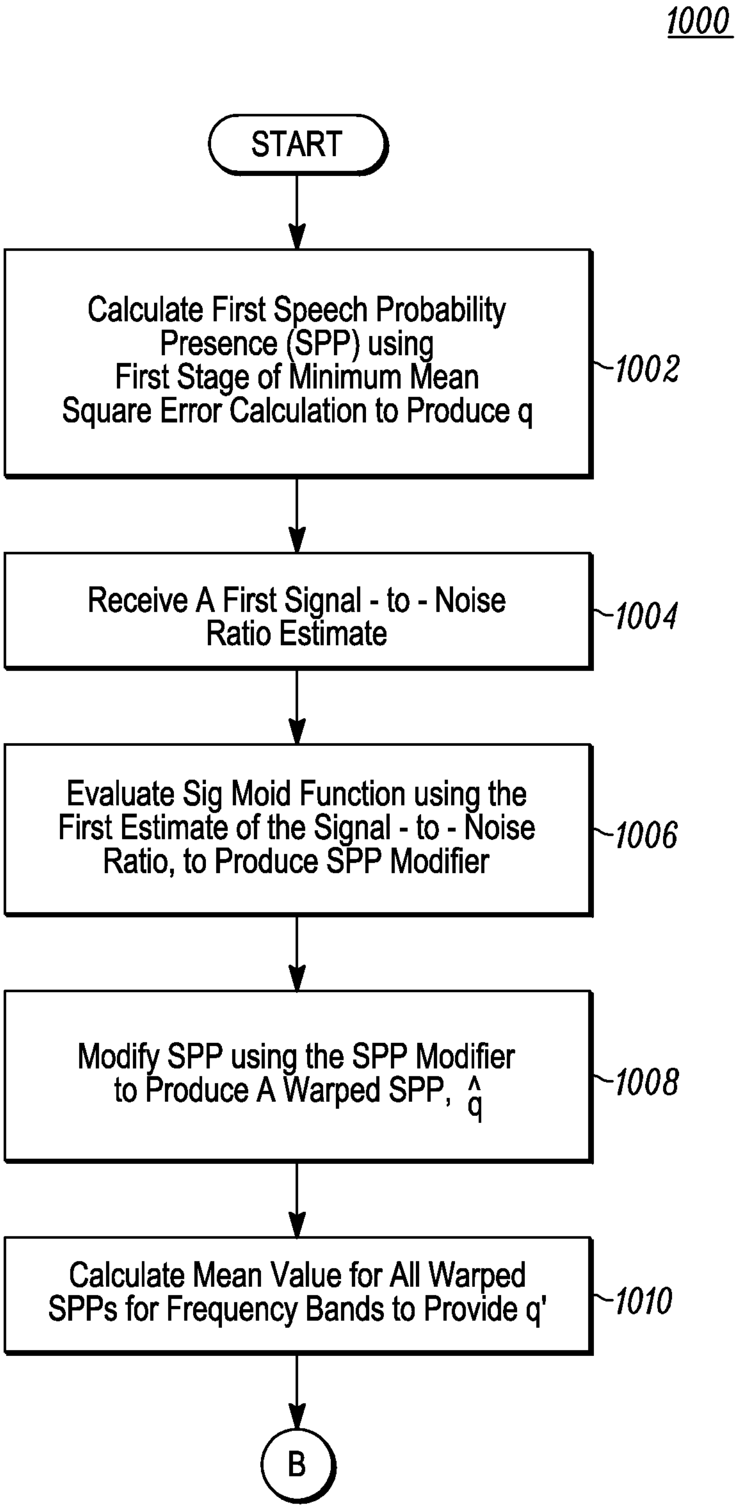
FIG. 10A and FIG. 10B show first and second parts, respectively, of a flow chart depicting steps of a method for warping or modifying a speech presence probability (SPP) and de-noising a warped SPP.
Figure 10B:
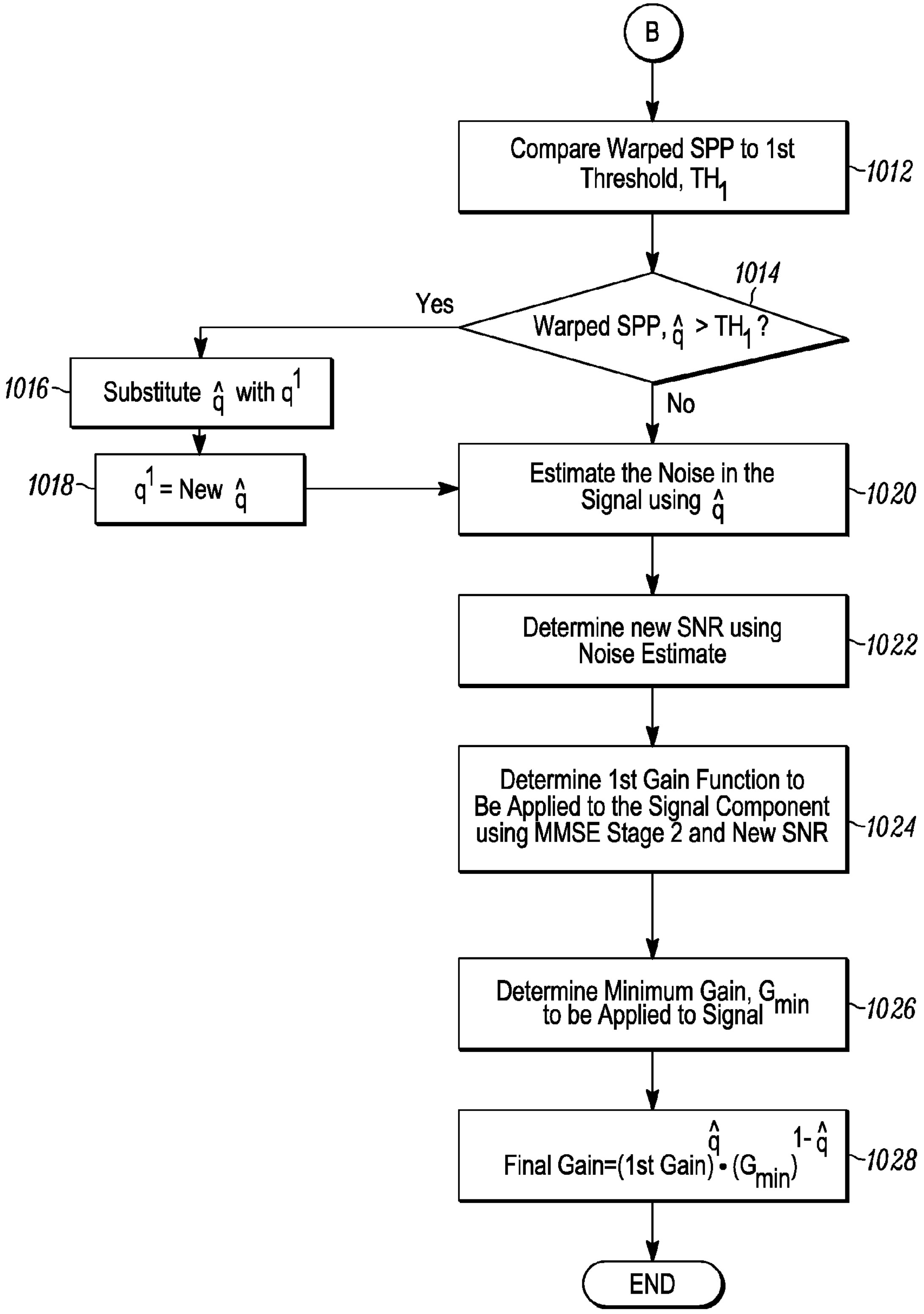

Still referring to FIG. 9, the determination of an SPP and a warped SPP is performed for all frequency bands of a frame. In the preferred embodiment, after the warped SPPs are calculated at step 904 for all frequency bands of a frame, the SPP's are "de-noised" at step 906, the details of which are shown in FIG. 10, which shows steps of a method 1000 of de-noising warped SPPs.

At a first step 1002, described above, an SPP or $\hat{q}$ is calculated by the evaluation of Ephraim and Cohen's Eq. 3.11. After a SNR as described herein is received at step 1004, an SPP modifier is determined at step 1006, which in the preferred embodiment is a value obtained by the evaluation of a sigmoid function, the "shape" of which is determined by the SNR received at step 1004. At step 1008, the SPP determined at step 1002 is modified to produce a warped SPP' or warped $\hat{q}$.

After warped SPPs are determined for all frequency bands comprising a frame of data, an average of the warped $\hat{q}$ values $(\bar{q})$ is determined at step 1010. After the average of all warped $\hat{q}$ values is determined at step 1010, at step 1012, each of the previously-calculated warped SPPs is compared to a first, minimum warped SPP threshold, TH1, to identify warped SPP values that might be aberrant. TH1 is predetermined and is preferably a value equal to the mean or average value for all warped $\hat{q}$ values, $(\bar{q})$, increased by two standard deviations of $\bar{q}$.

An arithmetic comparison is made at step 1014 wherein the value of a warped SPP is compared to TH1. If the value of a warped SPP is determined to be greater than TH1, the warped SPP is considered to be an aberration. At steps 1016 and 1018, the mean SPP $(\bar{q})$ is substituted for aberrant warped SPP values to provide a set of warped SPPs, the value of each indicating the probability that speech is present in a corresponding frequency band of a corresponding frame obtained from a time-varying signal.

At step 1020, a SNR estimate for each frequency band, as espoused by Ephraim and Cohen, is modified using the warped SPP value. A revised signal to noise ratio, SNR' is calculated at step 1022, the result of which at step 1024 provides a first gain function, $G_{mmse}$, which is to be multiplied against the frequency-domain frame data.

A minimum gain factor, $G_{min}$, is determined at step 1026.

In the last step 1028, a final gain factor is determined by multiplying the first modified gain function by the minimum gain raised to a power equal to one minus the warped SPP to provide a final gain factor that is applied to the received signal, which is to say applied to the frequency component of the received signal.

In a preferred embodiment, the speech probability presence factor that is generated by evaluation of the first stage of the MMSE calculation ranges between a first minimum value equal to zero and up to 1.0. The SPP factor is modified by an output of a sigmoid function the value of which preferably ranges from zero through one. In an alternate embodiment, the value of the speech probability presence factor output from the MMSE calculation can be values other than zero and one so long as they are all less than one. Similarly the values between which the SPP gain factor is modified can be values between zero and one so long as the values are less than one.

Figure 12:
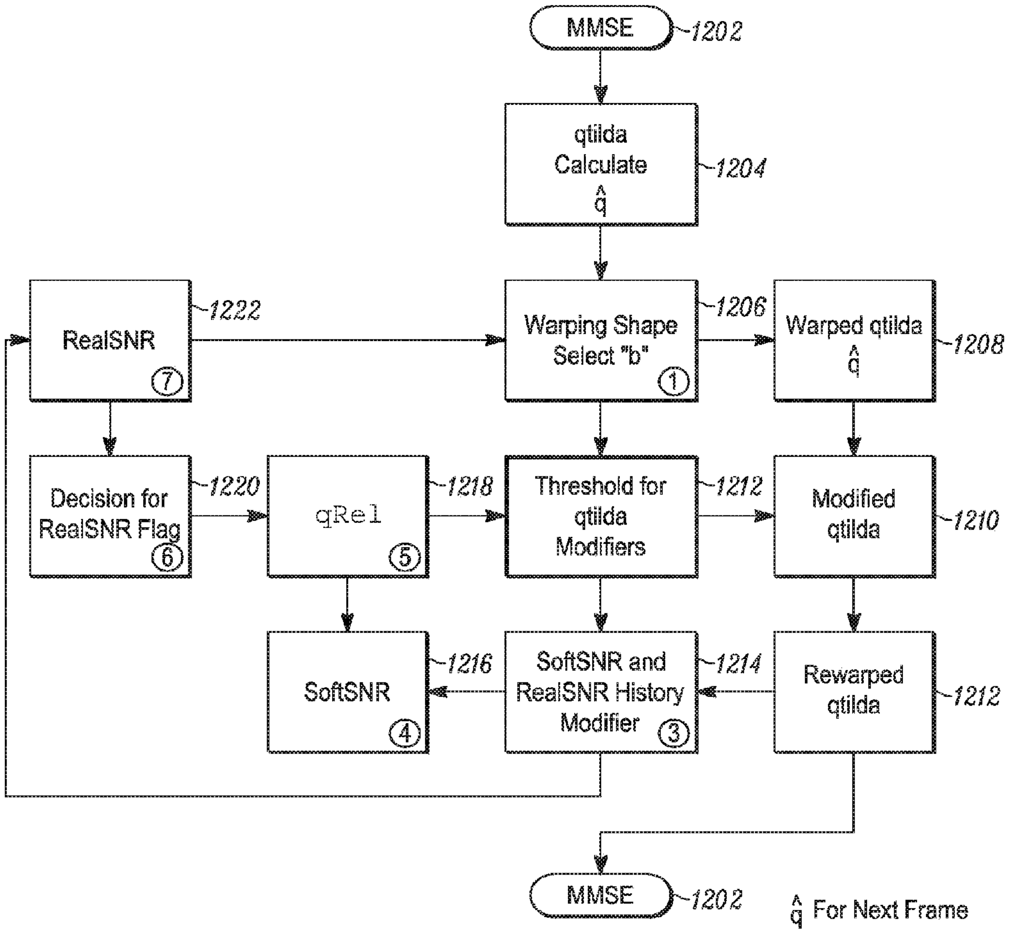
FIG. 12 depicts steps of a method for determining a signal-to-noise ratio.

The signal-to-noise ratios used to determine the shape of the sigmoid function and hence the warp factors and warped SPPs, are preferably determined using a methodology graphically depicted in FIG. 12.

In a preferred embodiment, determining a signal-to-noise ratio estimation actually relies on two SNR estimations and a new measure of reliability of speech probability presence. The first SNR estimation is referred to herein as a "soft-SNR." It is an SNR estimation that tends towards 0 dB very quickly over time when an audio signal is accompanied by a high level of acoustic noise, as will happen in noisy environments. A passenger compartment of a motor vehicle traveling at a relatively high speed with the windows lowered is a noisy environment. The second SNR estimate is referred to herein as a "realSNR," which is a fairly accurate SNR estimation that tends to be reliable even in noisy environments.

The new measure of speech probability presence reliability is referred to herein as "qRel." FIG. 12 shows how these components, softSNR, real SNR and qRel, interact with one another and result in the determination of a fairly accurate actual SNR that is used to determine the shape of the sigmoid function by which the Ephraim and Cohen determination of SPP is warped. FIG. 12 shows that various determinations are made simultaneously or in parallel with other determinations. Stated another way, the methodology depicted in FIG. 12 is not entirely sequential.

At steps 1202 and 1204, a SPP or $\hat{q}$ for a first frame of data is computed using the prior art method of Ephraim and Cohen. A sigmoid function of the form set forth above is evaluated, the mid-point P determined and a warp factor generated at steps 1206 and 1208.

At step 1210, the warp factor generated at step 1208 is modified. But the warp factor of step 1210 stays within or between threshold values for the warp factor received at step 1212. The thresholds are now computed as such $$Denoise_{thresh} = \begin{cases} Denoise_{max} & Denoise_{thresh} \geq Denoise_{max} \\ \frac{1}{2}(1 - qRel) & Denoise_{min} < Denoise_{thresh} < Denoise_{max} \\ Denoise_{min} & Denoise_{thresh} \leq Denoise_{min} \end{cases} \quad \text{(Eq. 6)}$$

Where qRel is a reliability factor of the speech probability presence. qRel trends towards 0 when high reliability is expected and towards 1 when unreliable.

Denoise_max and Denoise_min are experimentally-determined constants, typically about 0.3 and about 0.0, respectively, and are maximum and minimum values for the SPP warp factors. The Denoise threshold, $Denoise_{thresh}$ therefore trends toward Denoise_max when the SPP reliability, qRel, is high and trends toward Denoise_min when reliability, qRel, is low.

After adjusting the SPP at step 1210, a "re-warped" SPP is output at step 1212 for use in calculating SPP for the next frame of data. At step 1214, a "re-warped" SPP is used to calculate a "softSNR" and a "realSNR history modifier," a.

In determining a signal-to-noise ratio, it is helpful to consider a history of signal-to-noise values over a relatively short period of recent time. In determining a softSNR and realSNR, a SPP history modifier, $\propto_{hist}$, is introduced. Its value is calculated based on the mean and standard deviation of the speech probability presence as computed above.

The history modifier, $\propto_{hist}$, is computed in two steps. The first step is the linear transformation of the mean and standard deviation of SPP, limited between two values, k_1 and k_2, then expanded again between 0 and 1, as such:

$$\propto_{hist} = \begin{cases} k_1 & \propto_{hist} \geq k_1 \\ \text{mean}(q) + 2 * std(q) & k_2 < \propto_{hist} < k_1 \\ k_2 & \propto_{hist} \leq k_2 \end{cases} \quad \text{(Eq. 7)}$$

$$\propto_{hist} = \frac{\propto_{hist} - k_2}{k_1 - k_2}$$

In the equation above, k1 and k2 are experimentally-determined constants and typically about 0.2 and about 0.8, respectively. Companding and expanding empirically amplifies a differentiation between speech and noise and accelerates the SNR value changes or SNR "movement." The history modifier, $\propto_{hist}$, thus tends toward the value of 1.0 when mostly speech is present and tends toward the value 0.0 when mostly noise is detected.

A softSNR computation requires the computation of a long term speech energy, ltSpeechEnergy, which is preferably updated every frame, and the computation of a long term energy, ltNoiseEnergy. The update rate is based on an exponentially decreasing factor.

$$\text{ltSpeechEnergy} = \text{ALPHA}_{LT}^{\propto hist} \cdot \text{ltSpeechEnergy} + (1 - \text{ALPHA}_{LT}^{\propto hist}) \cdot \text{Mic} \quad \text{(Eq. 8)}$$

$$\text{ltNoiseEnergy} = \text{ALPHA}_{LT}^{(1-\propto hist)} \cdot \text{ltNoiseEnergy} + (1 - \text{ALPHA}_{LT}^{(1-\propto hist)}) \cdot \text{Mic} \quad \text{(Eq. 9)}$$

In the equations above, "Mic" is energy in joules, output from a microphone that detects speech and background acoustic noise. The equations above represent speech and noise energy as a function of the microphone output and ALPHA_LT, which is an experimentally-determined constant the value of which is typically 0.93, which corresponds to a microphone's fairly quick adaptation rate.

When $\propto_{hist}$ tends towards 1, as will happen when mostly speech is present, the long term speech energy ltSpeechEnergy, is updated according to a normal exponentially decreasing factor, while ltNoiseEnergy tends to keep its historical value.

When $\propto_{hist}$ tends towards 0, the opposite is true. At step 1218, a "softSNR" is determined from the long term speech energy and the long term noise energy. The soft SNR is thus determined using the long term speech energy and long term noise energy that are determined from Eq. 8 and 9 set forth above. The $SNR_{soft}$ can therefore be expressed as:

$$SNR_{soft} = \frac{ltSpeechEnergy}{ltNoiseEnergy} \quad \text{(Eq. 10)}$$

The SNR value, $SNR_{soft}$ is so called because its value is not fixed or rigid. Which is to say, it is continuously updated, and it tends to reach 0 dB when speech is not present due to unreliable speech probability estimation in very noisy environments.

At step 1218, the quantity, "qRel," is computed, which is a speech probability presence reliability estimation. qRel has a direct linear relationship with the softSNR value as set forth in the following equation.

$$qRel(SNR_{soft}) = \begin{cases} 1 & SNR_{soft} \le SNR_1 \\ \frac{SNR_{soft} - SNR_0}{SNR_1 - SNR_0} & SNR_1 < SNR_{soft} < SNR_0 \\ 0 & SNR_{soft} \ge SNR_0 \end{cases} \quad \text{(Eq. 11)}$$

The form of Equation 11 above is identical to Eq. 3, although its purpose is different. According to Eq. 11, when softSNR goes low, the reliability factor, qRel, trends toward 1; when softSNR goes high, the reliability factor, qRel, trends toward 0.

At step 1220, a "decision flag" for a realSNR is computed. The decision flag, which is used to update the realSNR, is actually the same variable used as a decreasing threshold seen in Eq. 6 for $Denoise_{thresh}$. When $Denoise_{thresh}$ is less than $Denoise_{max}$ the reliability of the SPP estimator shows it isn't "safe" to update the long term speech energy. It is however "safe" to update the noise energy because in high noise, the signal energy plus the noise energy is approximately equal to the noise energy by itself.

Finally, at step 1222, the realSNR is computed. Similarly to softSNR, realSNR uses the same history modifier on its exponential constant, but hard logic is now in place to enforce the update only when required, as the logic sequence in FIG. 12, shows, the speech and noise energy computation follow these equations:

$$ltSpeechEng = ALPHA_{LTreal}^{\propto hist} \cdot ltSpeechEng + (1 - ALPHA_{LTreal}^{\propto hist}) \cdot Mic \quad \text{(Eq. 12)}$$

$$ltNoiseEng = ALPHA_{LTreal}^{(1-\propto hist)} \cdot ltNoiseEng + (1 - ALPHA_{LTreal}^{(1-\propto hist)}) \cdot Mic \quad \text{(Eq. 13)}$$

The computation of $\propto_{hist}$ is as shown in Eq. 7 above. "Mic" is microphone energy. ALPHA_LT real is an experimentally-determined constant, typically about 0.99 (slow adaptation rate).

The realSNR, which is used to determine the sigmoid function shape, is computed using the long term speech energy and long term noise energy computed using Eq. 12 and 13 respectively. $SNR_{real}$ can thus be expressed as:

$$SNR_{real} = \frac{ltSpeechEng}{ltNoiseEng} \quad \text{(Eq. 14)}$$

It is important to note that initial values are assigned to softSNR and realSNR. Both are initially set to about 20 dB. Similarly, long term speech energy, ltSpeechEng is initially set to 100. Long term noise energy, ltNoiseEng, is also set to 1.0.

The foregoing description is for purposes of illustration. The true scope of the invention is set forth in the following claims.

The invention claimed is:

1. A method of reducing noise in an audio signal received at a microphone of a wireless communications device having a transmitter, the audio signal, which is received at the microphone being represented by a plurality of consecutive frames of data, each consecutive frame of data representing a plurality of consecutive samples of the received audio signal, the method comprising:

converting the audio signal received at the microphone to a plurality of consecutive frames of data representing said audio signal;

determining a signal to noise ratio (SNR) for a first frame responsive to energy generated by the microphone, and responsive to the determination of a softSNR and the determination of a realSNR for the first frame;

determining a warped speech probability presence (SPP) factor for the first frame using a minimum mean square error (MMSE) determiner, which uses a SPP factor determined for the first frame, multiplied by a sigmoid function having a shape known as a warping factor, the warped SPP factor for the first frame being determined by the determiner using the signal to noise ratio determined for the first frame;

determining if the warped SPP factor is between predetermined maximum and minimum values for the warped SPP factor;

determining a re-warped SPP factor by adjusting the warped SPP factor responsive to the determination of whether the warped SPP factor is between the first and second pre-determined maximum and minimum values for the warped SPP factor;

determining the softSNR and the realSNR for a second frame responsive to the determined re-warped SPP factor, the second frame following the first frame;

changing the shape of the sigmoid function responsive to the determined realSNR for the second frame;

determine a warped SPP factor for the second frame, based on multiplying the sigmoid function having the changed shape with a SPP factor for the second frame;

obtaining a set of warped SPP factors by determining a warped SPP factor for each frequency band of the second frame;

determining an average value for the set of warped SPP factors;

comparing the warped SPP factor of the second frame to a predetermined minimum warped SPP factor threshold value;

if the value of the warped SPP factor under comparison is determined to be greater than the threshold value, substituting the average value for the set of warped SPP factors in place of the warped SPP factor under comparison;

modifying SNR estimate for each frequency band using the warped SPP factor or averaged valued of warped SPP factors for each frequency band of the second frame;

determine a new SNR for the second frame responsive to the modified SNR estimate for each frequency band;

determine a gain factor for the second frame using the MMSE calculation and the new SNR;

determine a minimum gain to be applied to the signal;

reducing the noise content in the second frame by adjusting a final gain applied to the second frame, wherein the final gain is calculated using the minimum gain to be applied to the signal and the gain factor for the second frame;

re-converting the reduced-noise content second frame to an audio signal;

providing the reduced noise content second frame to the wireless communications device.

2. The method of claim 1, wherein the step of determining the warping factor for the SPP factor comprises:

evaluating the sigmoid function having a midpoint and a slope, the midpoint of the sigmoid function being selected to reduce the value of the warping factor when the new SNR for the second frame is below a first, predetermined limit.

3. The method of claim 2, wherein the midpoint of the sigmoid function is determined responsive to the new SNR for the second frame.

4. The method of claim 1, wherein the step of determining the warping factor for the SPP factor comprises:

evaluating the sigmoid function having a midpoint and a slope, the midpoint of the sigmoid function being selected to increase the value of the warping factor when the new SNR is above a second, predetermined limit.

5. An apparatus for reducing noise in an audio signal received at a microphone of a wireless communications device, the audio signal, which is received at the microphone being represented by a plurality of consecutive frames of data, each frame representing a plurality of consecutive samples of the received audio signal, the apparatus comprising:

a digital signal processor; and a non-transitory memory device coupled to the digital signal processor (DSP), the non-transitory memory device storing program instructions, which when executed cause the digital signal processor to:

receive audio signals from the microphone and convert the audio signals to a plurality of consecutive frames of data representing said audio signals;

determine a signal to noise ratio (SNR) for a first frame responsive to energy generated by the microphone, and responsive to the determination of a softSNR and the determination of a realSNR for the first frame;

determine a warped speech probability presence (SPP) factor and gain factor for the first frame using a minimum mean square error (MMSE) calculation, which uses a SPP factor determined for the first frame, multiplied by a sigmoid function having a shape known as a warping factor, the warped SPP factor for the first frame being determined using the signal to noise ratio determined for the first frame;

determine if the warped SPP factor is between pre-determined maximum and minimum values for the warped SPP factor;

determine the softSNR and the realSNR for a second frame responsive to the determined re-warped SPP factor, the second frame following the first frame;

determine a re-warped SPP factor by adjusting the warped SPP factor responsive to the determination of whether the warped SPP factor is between the first and second pre-determined maximum and minimum values for the warped SPP factor;

determine a new SNR for the second frame responsive to energy generated by the microphone, and responsive to the determination of the softSNR and the determination of the realSNR for the second frame;

change the shape of the sigmoid function responsive to the determined realSNR for the second frame;

determine a warped SPP factor for the second frame, based on multiplying the sigmoid function having the changed shape with a SPP factor for the second frame;

obtaining a set of warped SPP factors by determining a warped SPP factor for each frequency band of the second frame;

determining an average value for the set of warped SPP factors;

comparing the warped SPP factor of the second frame to a predetermined minimum warped SPP factor threshold value;

if the value of the warped SPP factor under comparison is determined to be greater than the threshold value, substituting the average value for the set of warped SPP factors in place of the warped SPP factor under comparison;

modifying SNR estimate for each frequency band using the warped SPP factor or averaged valued of warped SPP factors for each frequency band of the second frame;

determine a new SNR for the second frame responsive to the modified SNR estimate for each frequency band;

determine a gain factor for the second frame using the MMSE calculation and the new SNR;

determine a minimum gain to be applied to the signal;

reducing the noise content in the second frame by adjusting a final gain applied to the second frame, wherein the final gain is calculated using the minimum gain to be applied to the signal and the gain factor for the second frame;

re-convert the reduced-noise content second frame to an audio signal; and provide the reduced-noise content second frame to the wireless communications device.

6. The apparatus of claim 5, wherein the non-transitory memory device stores additional instructions, which when executed cause the DSP to:

evaluate the sigmoid function having a midpoint and a slope, the midpoint of the sigmoid function being selected to reduce the value of the warping factor when the new SNR for the second frame is below a first, predetermined limit.

7. The apparatus of claim 6, wherein the non-transitory memory device stores additional instructions, which when executed cause the DSP to:

determine a midpoint of the sigmoid function responsive to the new SNR for the second frame.

8. The apparatus of claim 6, wherein the non-transitory memory device stores additional instructions, which when executed cause the DSP to:

evaluate the sigmoid function having a midpoint and a slope, the midpoint of the sigmoid function being selected to increase the value of the warping factor when the new SNR for the second frame is above a second, predetermined limit.

* * * * *